(12) United States Patent
Shiokawa et al.

(10) Patent No.: US 10,593,867 B2
(45) Date of Patent: Mar. 17, 2020

(54) SPIN CURRENT MAGNETIZATION ROTATIONAL ELEMENT, METHOD OF MANUFACTURING THE SAME, MAGNETORESISTANCE EFFECT ELEMENT, AND MAGNETIC MEMORY

(71) Applicant: TDK CORPORATION, Tokyo (JP)

(72) Inventors: Yohei Shiokawa, Tokyo (JP);
Tomoyuki Sasaki, Tokyo (JP); Tohru Oikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/077,570

(22) PCT Filed: Nov. 14, 2017

(86) PCT No.: PCT/JP2017/040910
§ 371 (c)(1),
(2) Date: Aug. 13, 2018

(87) PCT Pub. No.: WO2018/101028
PCT Pub. Date: Jun. 7, 2018

(65) Prior Publication Data
US 2019/0051816 A1 Feb. 14, 2019

(30) Foreign Application Priority Data

Dec. 2, 2016 (JP) .................................. 2016-235327

(51) Int. Cl.
*H01L 43/02* (2006.01)
*H01L 43/12* (2006.01)
(Continued)

(52) U.S. Cl.
CPC ............ *H01L 43/02* (2013.01); *G11C 11/161* (2013.01); *G11C 11/1675* (2013.01);
(Continued)

(58) Field of Classification Search
CPC ........ H01L 43/02; H01L 27/222; H01L 43/12; H01L 43/10; G11C 11/161; H01F 10/3254; H01F 10/3286
See application file for complete search history.

(56) References Cited

U.S. PATENT DOCUMENTS 8,350,347 B2    1/2013  Gaudin et al.
2014/0056060 A1*  2/2014  Khvalkovskiy ....... H01L 27/228
                                                          365/158
(Continued)

FOREIGN PATENT DOCUMENTS

JP    2010-245415 A    10/2010
JP    2014-045196 A     3/2014
(Continued)

OTHER PUBLICATIONS

S. Fukami et al. "A Spin-Orbit Torque Switching Scheme With Collinear Magnetic Easy Axis and Current Configuration". Nature Nanotechnology, Mar. 21, 2016, vol. 11, No. 621, pp. 1-6.
(Continued)

*Primary Examiner* — Fernando L Toledo
*Assistant Examiner* — Neil R Prasad
(74) *Attorney, Agent, or Firm* — Oliff PLC

(57) ABSTRACT

A spin current magnetization rotational element includes: a first ferromagnetic metal layer having a variable magnetization direction; and a spin orbital torque wiring which is joined to the first ferromagnetic metal layer and extends in a direction crossing a direction perpendicular to a plane of the first ferromagnetic metal layer, wherein the spin orbital torque wiring is constituted of a non-magnetic material composed of elements of two or more kinds and a compositional proportion of the non-magnetic material has a non-uniform distribution between a first surface joined to the first
(Continued)

ferromagnetic metal layer and a second surface located on a side opposite to the first surface.

14 Claims, 4 Drawing Sheets

(51) Int. Cl.
    *H01L 27/22*     (2006.01)
    *H01F 10/32*     (2006.01)
    *G11C 11/16*     (2006.01)
    *G11C 11/18*     (2006.01)
    *H01L 43/10*     (2006.01)

(52) U.S. Cl.
    CPC ............ *G11C 11/18* (2013.01); *H01F 10/325* (2013.01); *H01F 10/3254* (2013.01); *H01F 10/3286* (2013.01); *H01L 27/222* (2013.01); *H01L 43/12* (2013.01); *H01L 43/10* (2013.01)

(56) References Cited

U.S. PATENT DOCUMENTS

| | | | |
|---|---|---|---|
| 2015/0162529 A1* | 6/2015 | Lee ..................... | H01L 45/1253 711/118 |
| 2015/0348606 A1 | 12/2015 | Buhrman et al. | |
| 2017/0077394 A1* | 3/2017 | Saida ....................... | H01L 43/10 |
| 2017/0221577 A1* | 8/2017 | Choe .................. | G11C 19/0841 |
| 2017/0222135 A1 | 8/2017 | Fukami et al. | |

FOREIGN PATENT DOCUMENTS

| | | |
|---|---|---|
| WO | 2016/021468 A1 | 2/2016 |
| WO | 2016/159017 A1 | 10/2016 |

OTHER PUBLICATIONS

Shunsuke Fukami et al. "Magnetization Switching by Spin-Orbit Torque in an Antiferromagnet-Ferromagnet Bilayer System". Nature Materials, Feb. 15, 2016, vol. 15, pp. 535-542.
Y. Niimi et al. "Giant Spin Hall Effect Induced by Skew Scattering From Bismuth Impurities Inside Thin Film CuBi Alloys". Physical Review Letters, Oct. 12, 2012, vol. 109, pp. 156602-1 through 156602-5.
Y.K. Kato et al. "Observation of the Spin Hall Effect in Semiconductors". Science, Dec. 10, 2004, vol. 306, pp. 1910-1913.
Ioan Mihai Miron et al. "Perpendicular Switching of a Single Ferromagnetic Layer Induced by In-Plane Current Injection". Nature, Aug. 11, 2011, vol. 476, pp. 189-194.
Luqiao Liu et al. "Spin Torque Switching With the Giant Spin Hall Effect of Tantalum". Science, Mar. 13, 2012, vol. 336, pp. 1-19.
Luqiao Liu et al. "Current-Induced Switching of Perpendicularly Magnetized Magnetic Layers Using Spin Torque From the Spin Hall Effect". Physical Review Letters, Aug. 31, 2012, vol. 109, pp. 096602-1 through 096602-5.
Ki-Seung Lee et al. "Threshold Current for Switching of a Perpendicular Magnetic Layer Induced by Spin Hall Effect". Applied Physics Letters, Mar. 25, 2013, vol. 102, pp. 112410-1 through 112410-17.
Ki-Seung Lee et al. "Thermally Activated Switching of Perpendicular Magnet by Spin-Orbit Spin Torque". Applied Physics Letters, 2014, vol. 104, pp. 072413-1 through 072413-5.
Guoqiang Yu et al. "Switching of Perpendicular Magnetization by Spin-Orbit Torques in the Absence of External Magnetic Fields". Nature Nanotechnology, May 11, 2014, vol. 9, pp. 548-554.
Martin Gradhand et al. "Spin Hall Angle Versus Spin Diffusion Length: Tailored by Impurities". Physical Review B, 2010, vol. 81, pp. 245109-1 through 245109-5.
Piotr Laczkowski et al. "Experimental Evidences of a Large Extrinsic Spin Hall Effect in AuW Alloy". Applied Physics Letters, Aug. 22, 2014, vol. 104, pp. 142403-1 through 142403-5.
Wei Zhang et al. "Spin Hall Effects in Metallic Antiferromagnets". Physical Review Letters, Nov. 7, 2014, vol. 113, pp. 196602-1 through 196602-6.
T. Kimura et al. "Estimation of Spin-Diffusion Length From the Magnitude of Spin-Current Absorption; Multiterminal Ferromagnetic/Nonferromagnetic Hybrid Structures". Physical Review B, 2005, vol. 72, pp. 014461-1 through 014461-6.
S. Takahashi et al. "Spin Injection and Detection in Magnetic Nanostructures". Physical Review B, 2003, vol. 67, pp. 052409-1 through 052409-4.
Jack Bass et al. "Spin-Diffusion Lengths in Metals and Alloys, and Spin-Flipping at Metal/Metal Interfaces: An Experimentalist's Critical Review". Journal of Physics: Condensed Matter, Apr. 4, 2007, vol. 19, No. 18, pp. 183201-1 through 183201-50.

\* cited by examiner

SPIN CURRENT MAGNETIZATION ROTATIONAL ELEMENT, METHOD OF MANUFACTURING THE SAME, MAGNETORESISTANCE EFFECT ELEMENT, AND MAGNETIC MEMORY

TECHNICAL FIELD

The present disclosure relates to a spin current magnetization rotational element, a method of manufacturing the same, a magnetoresistance effect element, and a magnetic memory.

Priority is claimed on Japanese Patent Application No. 2016-235327, filed Dec. 2, 2016, the content of which is incorporated herein by reference.

BACKGROUND ART

Giant magnetoresistance (GMR) elements formed of multilayer films, i.e., ferromagnetic layers and non-magnetic layers, and tunneling magnetoresistance (TMR) elements using insulating layers (tunnel barrier layers or barrier layers) as non-magnetic layers are known. Generally, TMR elements have higher element resistances than GMR elements and magnetoresistance (MR) ratios of TMR elements are higher than MR ratios of GMR elements. For this reason, TMR elements have attracted attention as elements for magnetic sensors, high frequency components, magnetic heads, and nonvolatile random access memories (MRAMs).

In an MRAM, data is read and written using characteristics in which an element resistance of a TMR element changes when magnetization directions of two ferromagnetic layers sandwiching an insulating layer change. As writing methods for MRAMs, a method in which writing (magnetization reversal) is performed using a magnetic field produced by a current and a method in which writing (magnetization reversal) is performed using a spin transfer torque (STT) occurring when a current flows in a lamination direction of a magnetoresistance effect element are known. Magnetization reversals of TMR elements using an STT are efficient from the viewpoint of energy efficiency, but an inversion current density to cause magnetization reversal is large. In order to improve the durability of TMR elements, it is desirable that reversal current densities be low. This applies to GMR elements.

Since a reversal current density due to an STT is proportional to a volume of a ferromagnetic material constituting a ferromagnetic layer, it has been attempted to reduce the reversal current density by reducing the volume of the ferromagnetic material. However, on the other hand, there is a problem that a magnetic recording holding time is shortened when the volume of the ferromagnetic material is reduced. This is because the energy of the ferromagnetic material depends on the magnetically anisotropic energy and a volume of the ferromagnetic material and thus the energy of the ferromagnetic material weakens and it becomes impossible to maintain a ferromagnetic magnetic order when the volume of the ferromagnetic material is decreased, and as a result, thermal disturbance due to heat from the outside is caused. Therefore, in order to maintain a magnetic recording holding time, resilience and high thermal stability in response to thermal disturbance are also required, but in a method using an STT, it is difficult to reduce a reversal current density without reducing the volume of a ferromagnetic material.

Therefore, in recent years, as means for reducing a reverse current with a mechanism different from an STT, attention has been focused on magnetization reversal using a pure spin current generated by a spin orbit interaction (for example, Non-Patent Literatures 1 to 3). A pure spin current generated by spin orbit interaction induces a spin orbital torque (SOT) and magnetization reversal is caused by the SOT. Furthermore, a pure spin current generated by a Rashba effect at an interface between different materials also causes magnetization reversal due to the same SOT. However, these mechanisms have not yet been clarified. A pure spin current is generated when the same number of electrons with an upward spin and electrons with a downward spin flow in opposite directions and flows of charge cancel each other out. For this reason, a current flowing through a magnetoresistance effect element is zero and realization of a magnetoresistance effect element with a small reversal current density would be expected, but it is currently reported in Non-Patent Literature 1 or the like that an reversal current density due to an SOT is substantially the same as an reversal current density due to an STT.

CITATION LIST

Non-Patent Literature

[Non-Patent Literature 1]
  S. Fukami, T. Anekawa, C. Zhang and H. Ohno, Nature Nano Tech (2016). DOI: 10.1038/NNANO.2016.29
[Non-Patent Literature 2]
  S. Fukami, C. Zhang, S. DuttaGupta, A. Kurenkov and H. Ohno, Nature materials (2016). DOI: 10.1038/NMAT4566
[Non-Patent Literature 3]
  Y. Niimi, et al., Phys. Revi. Lett., 109, 156602 (2012)

SUMMARY OF INVENTION

Technical Problem

The present disclosure was made in view of the above-described circumstances and an object of the present disclosure is to provide a spin current magnetization rotational element in which an reversal current density is able to be reduced using magnetization reversal due to a pure spin current, a method of manufacturing a spin current magnetization rotational element, a magnetoresistance effect element including the spin current magnetization rotational element, and a magnetic memory including a plurality of magnetoresistance effect element.

Solution to Problem

In order to achieve the object, the present disclosure provides the following means.

(1) A spin current magnetization rotational element according to a first aspect of the present disclosure includes: a first ferromagnetic metal layer having a variable magnetization direction; and a spin orbital torque wiring which is joined to the first ferromagnetic metal layer and extends in a direction crossing a direction perpendicular to a plane of the first ferromagnetic metal layer, wherein the spin orbital torque wiring is constituted of a non-magnetic material composed of elements of two or more kinds and a compositional proportion of the non-magnetic material has a non-uniform distribution between a first surface joined to the first ferromagnetic metal layer and a second surface located on a side opposite to the first surface.

(2) In the spin current magnetization rotational element according to (1), the compositional proportion may be different between the first surface and the second surface.

(3) In the spin current magnetization rotational element according to (1) or (2), a distribution of the compositional proportion may be in a direction perpendicular to the plane of the first ferromagnetic metal layer.

(4) In the spin current magnetization rotational element according to any one of (1) to (3), the compositional proportion may have a continuous distribution.

(5) In the spin current magnetization rotational element according to (4), the compositional proportion may have a distribution which that monotonically increases from the first surface toward the second surface.

(6) In the spin current magnetization rotational element according to (4), the compositional proportion may have a distribution that monotonically decreases from the first surface toward the second surface.

(7) In the spin current magnetization rotational element according to any one of (1) to (4), the compositional proportion may have a peak between the first surface and the second surface.

(8) In the spin current magnetization rotational element according to any one of (1) to (7), the compositional proportion may have a distribution in a direction other than the plane-perpendicular direction of the first ferromagnetic metal layer.

(9) In the spin current magnetization rotational element according to any one of (1) to (8), the spin orbital torque wiring may include both a non-magnetic material including an element having an atomic number of 38 or less and a non-magnetic material including an element having an atomic number equal to or more than 39.

(10) In the spin current magnetization rotational element according to (9), 50 atm % or more of the non-magnetic material including an element having an atomic number equal to or less than 38 may be distributed in a region including the first surface and 50 atm % or more of the non-magnetic material including an element having an atomic number equal to or more than 39 may be distributed in a region including the second surface.

(11) A method of manufacturing a spin current magnetization rotational element according to a second aspect of the present disclosure is a method of manufacturing the spin current magnetization rotational element according to any one of (1) to (10), wherein in a step of forming the spin orbital torque wiring, a laminate is formed with layers made of non-magnetic materials having mutually different compositional proportions and the laminate is subjected to a heat treatment.

(12) A magnetoresistance effect element according to a third aspect of the present disclosure includes: the spin current magnetization rotational element according to any one of (1) to (10); a second ferromagnetic metal layer having a fixed magnetization direction; and a non-magnetic material layer sandwiched between the first ferromagnetic metal layer and the second ferromagnetic metal layer.

(13) A magnetic memory according to a fourth aspect of the present disclosure includes: a plurality of the magnetoresistance effect element according to (12).

Advantageous Effects of Invention

In the present disclosure, a state in which a compositional proportion of a non-magnetic material constituting a spin orbital torque wiring has a non-uniform distribution and a spatial symmetry in an internal structure of the spin orbital torque wiring has broken is provided. For this reason, a spin current contributing to magnetization reversal of a first ferromagnetic metal layer is spontaneously generated in the spin orbital torque wiring and accordingly a density of a current flowing from the outside to generate the spin current (reversal current density) can be reduced. Therefore, according to the present disclosure, a spin current magnetization rotational element in which an reversal current density is able to be reduced using magnetization reversal due to a pure spin current, a method of manufacturing the spin current magnetization rotational element, a magnetoresistance effect element including the spin current magnetization rotational element, and a magnetic memory including a plurality of magnetoresistance effect elements can be provided.

Figure 1:
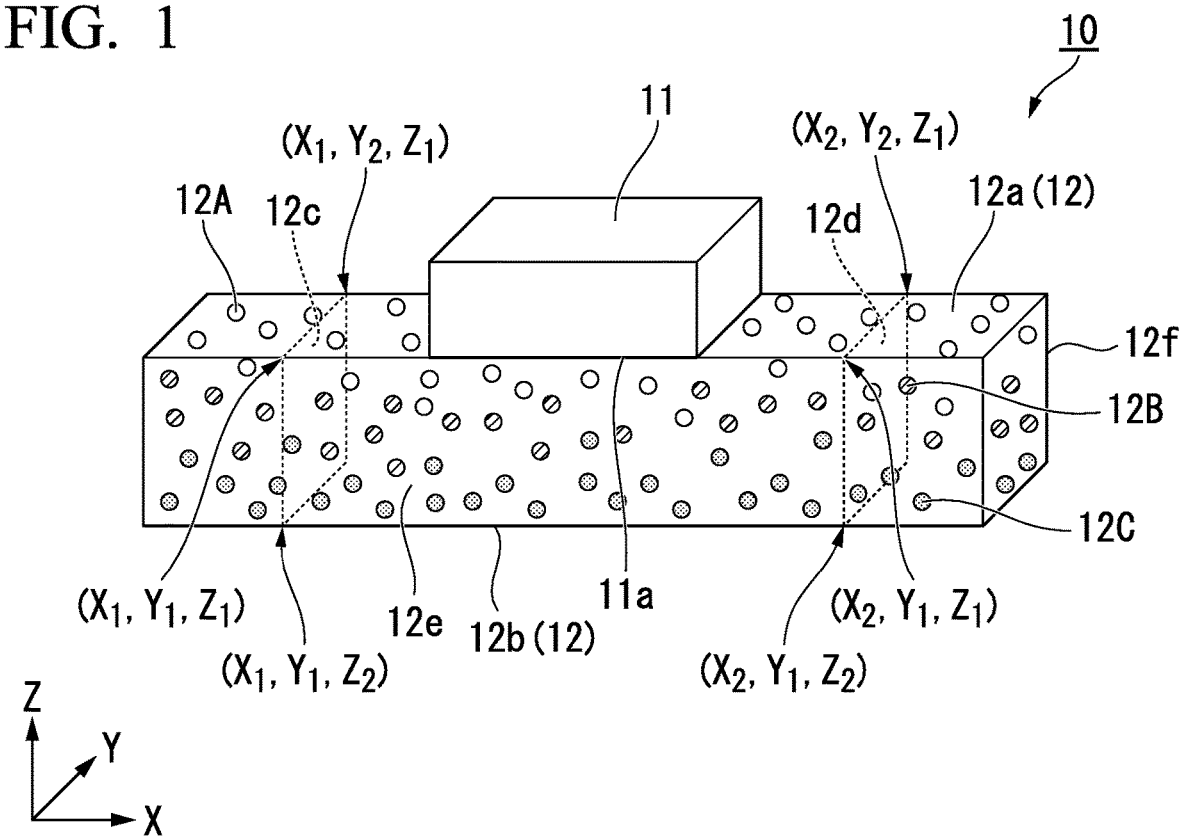
FIG. 1 is a perspective view schematically showing a constitution of a spin current magnetization rotational element according to an embodiment of the present disclosure.
Figure 4:
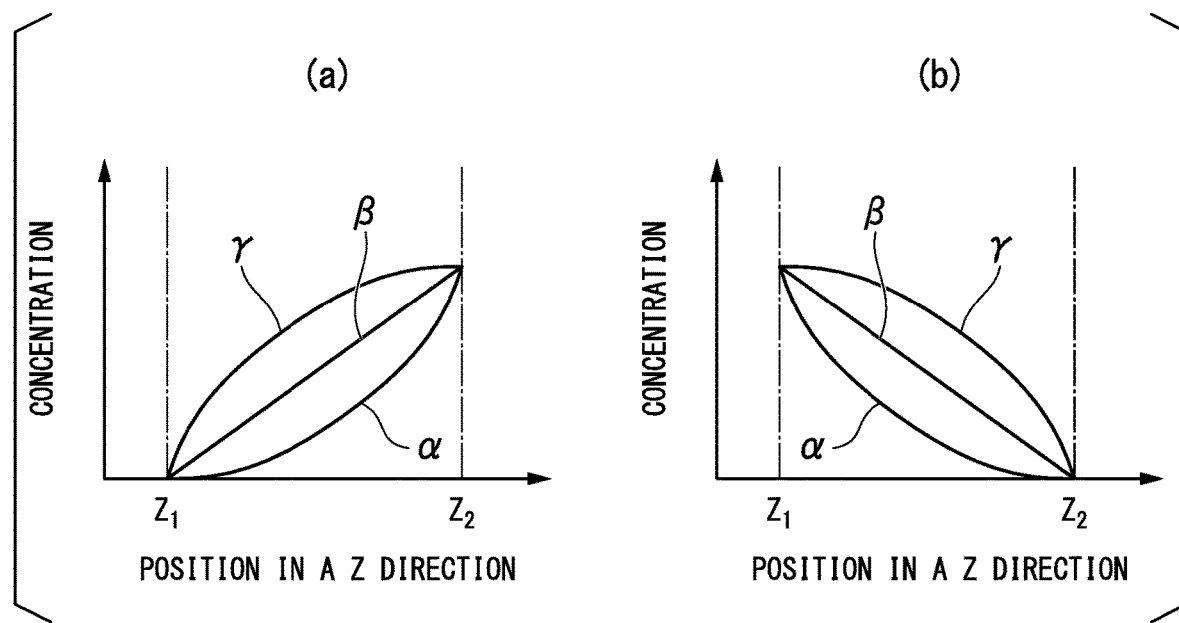

(a) and (b) of FIG. 4 are graphs showing a distribution of a compositional proportion of a material constituting the spin orbital torque wiring of FIG. 1 as another example.

Figure 5:
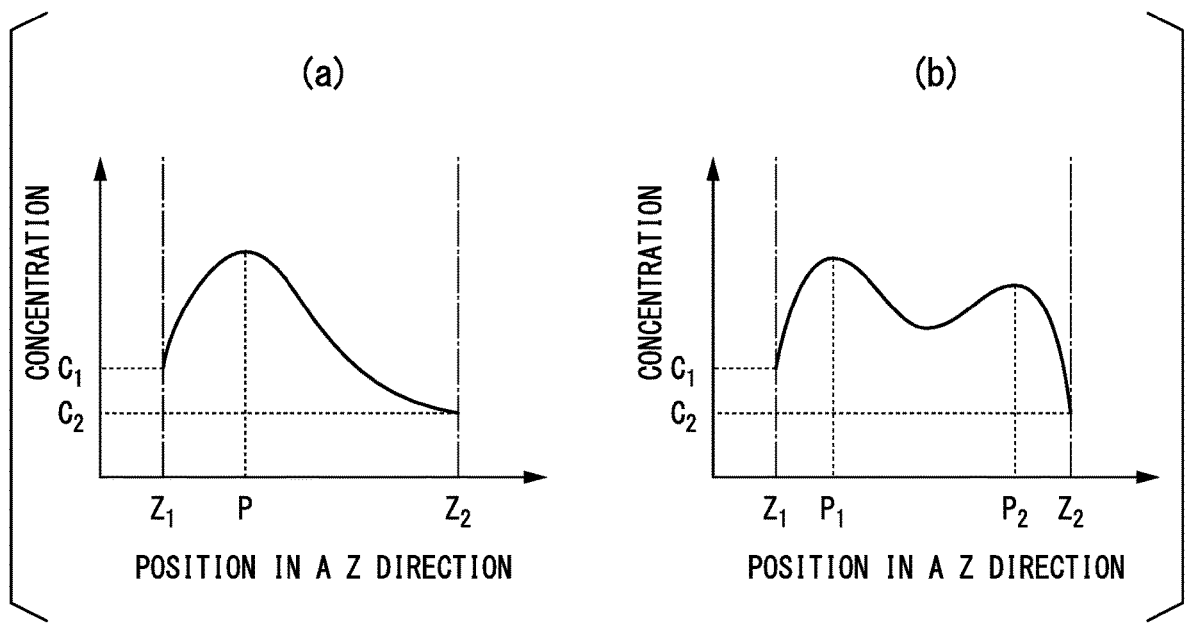

(a) and (b) of FIG. 5 are graphs showing a distribution of a compositional proportion of the materials constituting the spin orbital torque wiring of FIG. 1 as yet another example.

Figure 6:
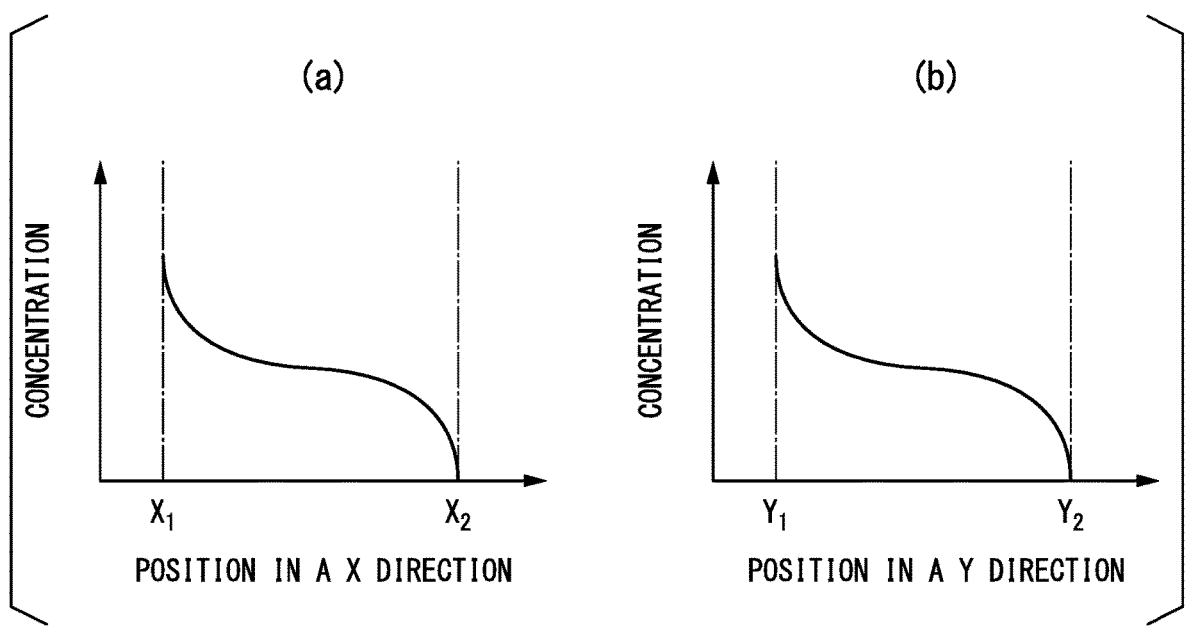

(a) and (b) of FIG. 6 are graphs showing a distribution of a compositional proportion of the materials constituting the spin orbital torque wiring of FIG. 1 as still another example.

Figure 7:
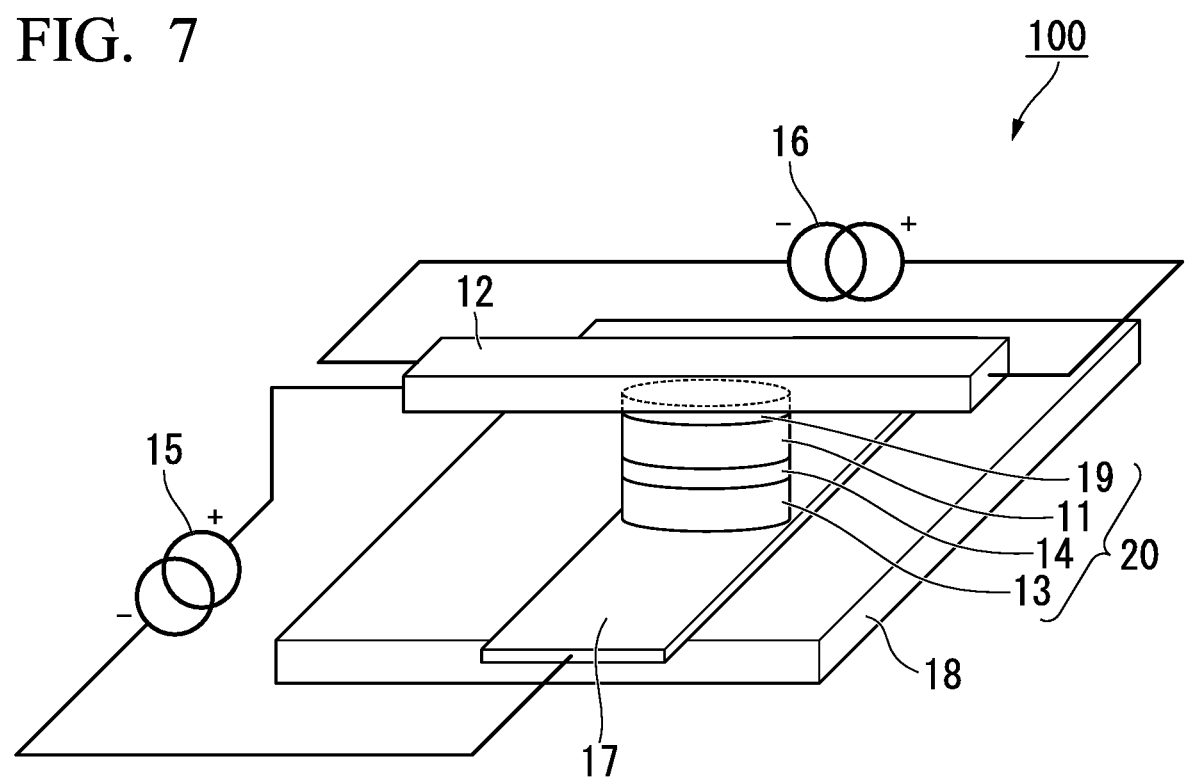

FIG. 7 is a perspective view of a magnetoresistance effect element including the spin current magnetization rotational element of FIG. 1.

DESCRIPTION OF EMBODIMENTS

The present disclosure will be described in detail below with reference to the drawings as appropriate. The drawings used in the following description sometimes show enlarged characteristic portions for the sake of convenience and in order to make the features of the present disclosure easier to understand, and the dimensional proportions or the like of each component may be different from actual ones. Materials, dimensions, and the like in the following description are merely exemplary examples, the present disclosure is not limited thereto, and the present disclosure can be realized by appropriately modifying these within a range in which the effects of the present disclosure are achieved. An element according to the present disclosure may include other layers within a range in which the effects of the present disclosure are achieved.

<Spin Current Magnetization Rotational Element>
[Constitution of Spin Current Magnetization Rotational Element]

A constitution of a spin current magnetization rotational element 10 according to an embodiment of the present disclosure will be described with reference to FIG. 1. FIG. 1 is a perspective view schematically showing the constitution of the spin current magnetization rotational element 10. The spin current magnetization rotational element 10 includes a first ferromagnetic metal layer 11 having a variable magnetization direction and a spin orbital torque (SOT) wiring layer 12 (spin orbital torque wiring 12) which is joined to the first ferromagnetic metal layer 11 and extends in a direction (preferably a direction which is orthogonal to) crossing a direction perpendicular to a first surface 11a of the first ferromagnetic metal layer 11 (direction perpendicular to a plane thereof). Hereinafter, the direction perpendicular to the plane of the first ferromagnetic metal layer with respect to the first surface 11a is set to a Z direction, an extending direction of a spin orbital torque wiring 12 is set to an X direction, and a direction which is orthogonal to both of the Z direction and the X direction is set to a Y direction. Furthermore, a surface of the first ferromagnetic metal layer 11 that is joined to the spin orbital torque wiring 12 or faces the spin orbital torque wiring 12 is set as the first surface 11a.

The first ferromagnetic metal layer 11 is made of a known material having ferromagnetism, for example, a metal selected from the group consisting of Cr, Mn, Co, Fe, and Ni, or a ferromagnetic alloy containing one or more of these metals. Furthermore, the first ferromagnetic metal layer 11 may be made of an alloy (specifically, Co—Fe or Co—Fe—B) or the like which contains one or more of these metals and at least one element from B, C, and N in some cases.

Also, in order to obtain a higher output, it is desirable to use a Heusler alloy such as $Co_2FeSi$. A Heusler alloy contains an intermetallic compound having a chemical composition represented by $X_2YZ$, where X is transition metal element or a noble metal element from the Co, Fe, Ni, or Cu groups in the periodic table, Y is a transition metal from the Mn, V, Cr, or Ti groups or an element of the X type, and Z is a typical element from Group III to Group V. For example, $Co_2FeSi$, $Co_2MnSi$, $Co_2Mn_{1-a}Fe_aAl_bSi_{1-b}$, and the like are exemplary examples.

The spin orbital torque wiring 12 has a function of generating a pure spin current by a spin Hall effect when a current flows therethrough and is constituted of a material (alloy or compound) such as a non-magnetic material composed of elements of two or more kinds. It is desirable that the spin orbital torque wiring 12 be formed of one crystal structure.

Figure 2:
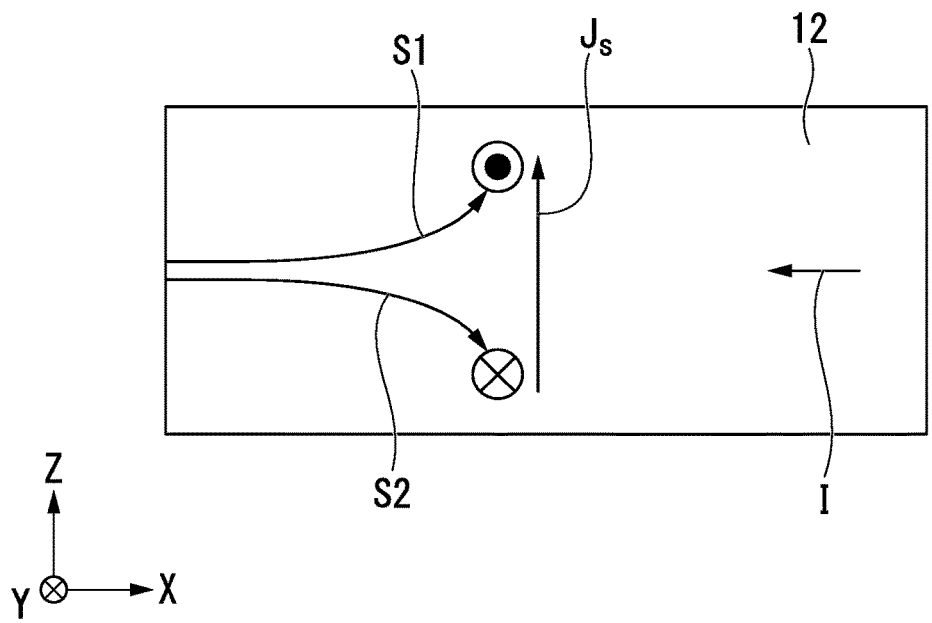
FIG. 2 is a schematic diagram showing a spin Hall effect.

FIG. 2 is a schematic diagram showing the spin Hall effect generated in the spin orbital torque wiring 12 of FIG. 1 and is a cross-sectional view of the spin orbital torque wiring 12 taken in the X direction (that is, along an XZ plane). A mechanism by which a pure spin current is generated by a spin Hall effect will be described with reference to FIG. 2.

As shown in FIG. 2, when a current I flows in the extending direction (−X direction) of the spin orbital torque wiring 12, a first spin S1 oriented in a −Y direction and a second spin S2 oriented in a +Y direction are bent in a direction which is orthogonal to a direction of the current I. A normal Hall effect and a spin Hall effect are the same in that a movement (traveling) direction of moving (traveling) charges (electrons) is bent. However, a normal Hall effect and a spin Hall effect significantly differ in that a normal Hall effect occurs only when a magnetic field is present, whereas a spin Hall effect occurs when electrons travel (when a current flows) due to an internal field (due to a magnetic action) arising from the breakage of a spatial inversion symmetry even when no magnetic field is present.

Since the number of electrons with the first spin S1 is equal to the number of electrons of the second spin S2 in a non-magnetic material (a material which is not a ferromagnetic material), the number of electrons with the first spin S1 facing upward is equal to the number of electrons of the second spin S2 facing downward in the drawing. For this reason, a current as a net flow of charge is zero. This spin current without a current is particularly called a pure spin current.

A case in which a current flows through a ferromagnetic material is the same as a case of a non-magnetic material in that the first spin S1 and the second spin S2 are bent in opposite directions. On the other hand, a case of a ferromagnetic material is different from a case of a non-magnetic material in that a state in which either of the first spin S1 or the second spin S2 is larger occurs in a ferromagnetic material, and as a result, a net flow of charge occurs (a voltage is generated). Therefore, no materials constituted of only ferromagnetic materials are used for materials of the spin orbital torque wiring 12.

Here, if a spin flow of the first spin S1 is represented by $J_\uparrow$, a spin flow of the second spin S2 is represented by $J_\downarrow$, and a spin current is represented by $J_S$, $J_S = J_\uparrow - J_\downarrow$ is defined. In FIG. 2, $J_S$ flows as a pure spin current in an upward direction in the drawing. Here, $J_S$ is a pure spin flow with a polarizability of 100%.

As shown in FIG. 1, when a ferromagnetic material is brought into contact with an upper surface of the spin orbital torque wiring 12, a pure spin current diffuses and flows into the ferromagnetic material. That is to say, spin is injected into the first ferromagnetic metal layer 11.

The spin current magnetization rotational element 10 according to the embodiment causes magnetization reversal of the first ferromagnetic metal layer due to an SOT effect due to a pure spin current by causing a current to flow through the spin orbital torque wiring 12 in this way to generate a pure spin current and the pure spin current diffusing into the first ferromagnetic metal layer 11 in contact with the spin orbital torque wiring 12.

From the viewpoint of generation efficiency of a pure spin current, as materials of the spin orbital torque wiring 12, it is desirable to use heavy metal elements which have d electrons or f electrons in the outermost shell and have an atomic number equal to or more than 39 and a strong spin orbit interaction. When a current flows through a metal with a small atomic number, all internal electrons travel in an opposite direction to that of the current regardless of a direction of each spin. On the other hand, since a spin orbit interaction is large when a current flows through a non-magnetic metal which has d electrons or f electrons in the outermost shell and has a large atomic number, a traveling direction of electrons depends on a direction of each spin due to a spin Hall effect and a pure spin current is likely to occur.

Although FIG. 1 shows an example in which the spin orbital torque wiring 12 is constituted of three kinds of materials (alloys or compounds) 12A, 12B, and 12C having mutually different compositional proportions, the spin orbital torque wiring 12 may be constituted of two or more kinds of materials. FIG. 1 schematically shows distribution states of the three kinds of materials 12A, 12B, and 12C.

A compositional proportion of a material (non-magnetic material) in the spin orbital torque wiring 12 has a non-uniform distribution between a first surface 12a joined to the first ferromagnetic metal layer 11 and a second surface 12b located on a side opposite thereto (a surface which is opposite to the first surface 12a and parallel to the first surface 12a). A non-uniform distribution mentioned herein refers to a distribution that is not uniform (even) between the first surface 12a and the second surface 12b of the spin orbital torque wiring. It is desirable that compositional proportions of materials be different between the first surface 12a and the second surface 12b. It is conceivable that a spin current may be generated due to breakage of symmetry and a pure spin be generated due to creating a non-uniform composition distribution which breaks a spatial symmetry.

A distribution of a compositional proportion can be checked by investigating a concentration distribution of a material with a specific compositional proportion among materials included in the spin orbital torque wiring 12. Examples of a method of investigating a concentration distribution include energy dispersive X-ray spectroscopy (EDX method). An EDX method is a method of performing composition analysis on a sample by irradiating the sample with an electron beam with a beam diameter of about 1 nm in diameter and spectrally dispersing characteristic X-ray energies of transmitted electrons.

Here, it is assumed that the first surface 12a and the second surface 12b have a minimum thickness which can be measured by an EDX method and this thickness is defined as resolution by the EDX method, that is, a thickness of about 1 nm (2 to 3 atomic layers).

Figure 3:
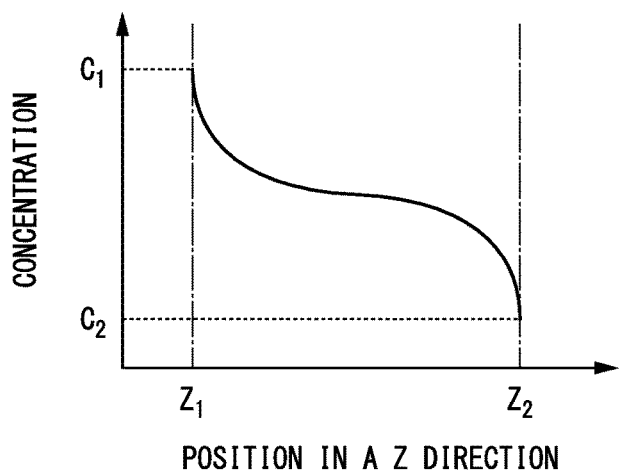
FIG. 3 is a graph showing a distribution of a compositional proportion of materials constituting the spin orbital torque wiring of FIG. 1 as an example.

An example of a distribution pattern for a compositional proportion that can be used in the embodiment will be described with reference to FIG. 3. FIG. 3 is a graph showing a case compositional proportion of a distribution in the direction perpendicular to the plane of the first ferromagnetic metal layer 11 (Z direction) of a material with a specific compositional proportion in the spin orbital torque wiring 12. A horizontal axis of the graph indicates a position in the Z direction and a vertical axis thereof indicates a concentration of a material with a specific compositional proportion. Reference symbols $Z_1$ and $Z_2$ attached to the horizontal axis indicate Z coordinates of the first surface 12a and the second surface 12b in the spin orbital torque wiring 12.

A concentration of a material with a specific compositional proportion in the spin orbital torque wiring 12 changes from the first surface 12a toward the second surface 12b and the first surface 12a and the second surface 12b have different concentrations $C_1$ and $C_2$. Although concentrations of materials with other compositional proportions also change between the first surface 12a and the second surface 12b, shapes of graphs representing concentration distributions are different for each constituent material. It can be seen that, with regard to a material with each of compositional proportions, a material with the same compositional proportion is non-uniformly distributed in the spin orbital torque wiring 12 when checking such concentration distributions.

When the spin orbital torque wiring 12 is formed of one crystal structure, a continuously changing distribution represented by a smooth curve is provided as shown in FIG. 3. In a case in which the spin orbital torque wiring 12 is composed of crystal structures of two or more types, or crystal structures having the same composition are spaced apart from each other, discontinuities in change in a distribution are represented by a curve having many irregularities.

Other distribution patterns of the compositional proportion that can be used in the embodiment are shown in FIGS. 4 to 6 as graphs of concentration distributions like in FIG. 3. Like in the graph of FIG. 3, horizontal axes of the graphs of FIGS. 4 to 6 indicate positions in the spin orbital torque wiring 12 and vertical axes thereof indicate concentrations of materials with specific compositional proportions.

(a) of FIG. 4 shows three examples in which a concentration of a material with a specific compositional proportion in the spin orbital torque wiring 12 monotonically increases from the first surface 12a toward the second surface 12b (a type α in which a gradient increases from the first surface 12a toward the second surface 12b, a type β in which an inclination does not change, and a type γ in which an inclination decreases from the first surface 12a toward the second surface 12b). Furthermore, (b) of FIG. 4 shows three examples in which one concentration monotonically decreases from the first surface 12a toward the second surface 12b (types α to γ).

(a) of FIG. 5 shows an example in which a distribution of one concentration has a peak (P) between the first surface 12a and the second surface 12b. Furthermore, (b) of FIG. 5 shows an example in which there are two peaks (P1 and P2) in one concentration between the first surface 12a and the second surface 12b. The number of peaks of a concentration distribution may be three or more. In any case, there is no restriction on a position, a height, and a shape of a peak and it is desirable that one concentration of the first surface 12a and the second surface 12b be changed to different concentrations C1 and C2.

(a) and (b) of FIG. 6 are graphs showing a case in which one concentration has a distribution in a direction other than the direction perpendicular to the plane (Z direction) of the first surface 11a in the first ferromagnetic metal layer, for example, in the X direction or the Y direction which is orthogonal to the direction perpendicular to the plane. Horizontal axes of the graphs indicate positions in the X direction and the Y direction. X1 and X2 of the horizontal axis in the graph of (a) of FIG. 6 indicate X coordinates of two cross sections (third surface 12c and fourth surface 12d) of the spin orbital torque wiring 12 in a longitudinal direction thereof (X direction). Y1 and Y2 of the horizontal axis in the graph of (b) of FIG. 6 indicate Y coordinates of two lateral surfaces (fifth surface 12e and sixth surface 12f) of the spin orbital torque wiring 12 in a lateral direction thereof. As shown in these graphs, materials with compositional proportions may be non-uniformly distributed in the XY surface. Materials with compositional proportions may be non-uniformly distributed not only in the XY surface but also in the Z direction.

It is only necessary that distributions of materials having each of compositional proportions be not uniform at least between the first surface 12a and the second surface 12b, such as for example, most of the material other than the first surface 12a having a uniform compositional proportion but different from that of the first surface 12a. Similarly, most of the portions other than the second surface 12b may have a uniform compositional proportion different from the compositional proportion of the second surface 12b.

Composition elements of materials in the spin orbital torque wiring 12 preferably include, for example, both (at least one of) an element having an atomic number of 38 or less (light metal element) and an element having an atomic number of 39 or more (heavy metal element). In this case, it is desirable that 50 atm % or more of a light metal element present in the spin orbital torque wiring 12 be distributed in a region including the first surface 12a and 50 atm % or more of a heavy metal element be distributed in a region including the second surface 12b. Since a light metal element has a long spin diffusion length, a spin current generated by a heavy metal element can be propagated to the first ferromagnetic metal layer 11 without leaking when the above-described distribution is provided and effectively used for magnetization reversal.

The number of electrons constituting a light metal element differs greatly from that of a heavy metal element, and the symmetry of a crystal structure increasingly breaks down in proportion to a difference in the numbers of electrons between materials having mutually different compositional proportions. That is to say, an effect of the breakage of the symmetry due to a distribution of the number of electrons is added to an effect of the breakage of the symmetry due to a distribution of a compositional proportion.

[Method of Manufacturing Spin Current Magnetization Rotational Element]

A method of manufacturing the spin current magnetization rotational element 10 shown in FIG. 1 will be described. First, a laminate, that is, the spin orbital torque wiring 12, is formed by laminating layers made of non-magnetic materials (alloys or compounds) with different compositional proportions above a predetermined substrate (base) using a magnetron sputtering apparatus or the like. Subsequently, the first ferromagnetic metal layer 11 made of the above-described ferromagnetic metal is formed above the spin orbital torque wiring 12.

In the layers constituting the spin orbital torque wiring 12, materials constituting all of the layers may include heavy metal elements, materials constituting some of the layers may include heavy metal elements, and materials constituting the remaining layers may include light metal elements. An order of forming the spin orbital torque wiring 12 and the first ferromagnetic metal layer 11 may be reversed in accordance with design circumstances in some cases.

Next, a heat treatment is performed on the formed spin-orbit torque wiring 12 for a short time at a low temperature in order that the distributions of the compositional proportions of the constituent materials become non-uniform. The temperature of the heat treatment is preferably 50° C. or more and 400° C. or less, more preferably 250° C. or more and 400° C. or less, but the present is not limited thereto. Furthermore, the duration of the heat treatment is preferably 10 minutes or more and 300 minutes or less and more preferably 30 minutes or more and 180 minutes or less, but the present disclosure is not limited thereto. There is no limitation to a heat treatment step having a constant temperature and there may be stepwise or continuous change to a plurality of temperatures. Through this heat treatment, a non-uniform composition distribution of each constituent material can be realized without forming an interface in the spin orbital torque wiring 12.

Also, formation of a spin orbital torque wiring having a non-uniform distribution of a compositional proportion can also be performed during a film formation step. A laminate obtained by laminating layers made of non-magnetic materials (alloys or compounds) with different compositional proportions is formed and then heat treatment may be performed in an ultra-high vacuum chamber. The temperature of the heat treatment at this time is preferably 50° C. or more and 400° C. or less and more preferably 150° C. or more and 300° C. or less, but the present disclosure is not limited thereto. Furthermore, the duration of the heat treatment is preferably 10 minutes or more and 120 minutes or less and more preferably 30 minutes or more and 120 minutes or less, but the present disclosure is not limited thereto. The degree of vacuum (pressure) in the ultra-high vacuum chamber is preferably $10^{-4}$ Pa or less and more preferably $10^{-8}$ Pa or more and $10^{-5}$ Pa or less, but the present disclosure is not limited thereto.

Subsequently, the formed first ferromagnetic metal layer 11 and spin orbital torque wiring 12 are covered with a resist or a protective film so that only unnecessary portions are exposed and the exposed unnecessary portions are removed using an ion milling method or a reactive ion etching (RIE) method. The substrate used when the first ferromagnetic metal layer 11 and the spin orbital torque wiring 12 are formed is usually removed after the two layers are formed, but may be left as necessary.

As described above, in the embodiment, a compositional proportion of materials constituting the spin orbital torque wiring has a non-uniform distribution and spatial symmetry of an internal structure in the spin orbital torque wiring is broken. For this reason, a spin current contributing to magnetization reversal of the first ferromagnetic metal layer is spontaneously generated in the spin orbital torque wiring and accordingly a density (reversal current density) of a current flowing from the outside to generate the spin current can be reduced. Therefore, according to the embodiment, a spin current magnetization rotational element in which the reversal current density is able to be reduced using magnetization reversal due to a pure spin current, a method of manufacturing the spin current magnetization rotational element, and a magnetoresistance effect element including the spin current magnetization rotational element can be provided.

The spin current magnetization rotational element 10 according to the embodiment can be applied to a magnetoresistance effect element as will be described later. In addition to a magnetoresistance effect element, for example, the spin current magnetization rotational element 10 can also be applied to a spatial light modulator which includes the above-described spin current magnetization rotational element disposed in each pixel, utilizes a magneto-optical effect, and spatially modulates incident light.

<Magnetoresistance Effect Element>

FIG. 7 is a perspective view schematically showing a constitution of a magnetoresistance effect element 100 to which the spin current magnetization rotational element 10 according to the embodiment of the present disclosure is applied. The magnetoresistance effect element 100 includes the spin current magnetization rotational element 10, a second ferromagnetic metal layer 13 which is disposed above the first ferromagnetic metal layer 11 constituting the spin current magnetization rotational element 10 and have a fixed magnetization direction, and a non-magnetic material layer 14 sandwiched between the first ferromagnetic metal layer 11 and the second ferromagnetic metal layer 13.

The first ferromagnetic metal layer 11 is referred to as a free layer or a memory layer in some cases. Furthermore, the second ferromagnetic metal layer 13 is referred to as a fixed layer or a reference layer in some cases. The first ferromagnetic metal layer 11 and the second ferromagnetic metal layer 13 may be in-plane magnetized films whose magnetization directions are in-plane directions which are parallel to the layers (which are perpendicular to lamination directions (or direction perpendicular to the planes) of the layers) or may be perpendicularly magnetized films whose magnetization directions are perpendicular to the layers (which are lamination directions (or direction perpendicular to the plane) of the layers). Hereinafter, a laminate obtained by sequentially laminating the first ferromagnetic metal layer 11, the non-magnetic material layer 14, and the second ferromagnetic metal layer 13 above the spin orbital torque wiring 12 is referred to as a magnetic effect resistance effect element section 20.

The magnetoresistance effect element 100 further includes a first power supply 15 configured to cause a current to flow through the magnetic effect resistance effect element section 20 in a lamination direction thereof and a second power supply 16 configured to cause a current to flow through the spin orbital torque wiring 12 in an extending direction thereof. One end (+ terminal or − terminal) side of the first power supply 15 is connected to the spin orbital torque wiring 12 and the other end (− terminal or + terminal) side thereof is connected to the second ferromagnetic metal layer 13 with a wiring layer 17 having conductivity therebetween. One end side and the other end side of the second power supply 16 are connected to one end side and the other end side of the spin orbital torque wiring 12 in the extending direction thereof. The wiring layer 17 is formed on one surface of a substrate 18 constituting the magnetoresistance effect element 100.

A magnetoresistance effect element section 20 (which is also referred to as a "magnetic effect resistance effect element section 20") operates when the magnetization of the second ferromagnetic metal layer 13 is fixed in one direction and a magnetization direction of the first ferromagnetic metal layer 11 relatively changes. When the magnetoresistance effect element section 20 is applied to a coercive force difference type (pseudo spin valve type) magnetoresistive random access memory (MRAM), the coercive force of the second ferromagnetic metal layer 13 is required to be larger than the coercive force of the first ferromagnetic metal layer 11. Furthermore, when the magnetoresistance effect element section 20 is applied to an exchange bias type (spin valve type) MRAM, a magnetization direction of the second ferromagnetic metal layer 13 is required to be fixed by exchange coupling with an anti-ferromagnetic layer. The magnetoresistance effect element section 20 corresponds to a tunneling magnetoresistance (TMR) element when a non-magnetic layer 14 (non-magnetic material layer 14) is made of an insulator and corresponds to a giant magnetoresistance (GMR) element when the non-magnetic layer 14 is made of a metal.

In order to further increase a coercive force of the second ferromagnetic metal layer 13 with respect to the first ferromagnetic metal layer 11, an anti-ferromagnetic material such as IrMn and PtMn may be used as a material in contact with the second ferromagnetic metal layer 13. In addition, in order to prevent a leakage magnetic field of the second ferromagnetic metal layer 13 from affecting the first ferromagnetic metal layer 11, a synthetic ferromagnetic coupling structure may be adopted. To be specific, these materials may be provided between the second ferromagnetic metal layer 13 and the wiring layer 17.

It is desirable to use a laminated film made of Co and Pt as the second ferromagnetic metal layer 13 when the magnetization direction of the second ferromagnetic metal layer 13 is perpendicular to a laminated surface. Examples of a constitution of the laminated film in this case include [Co (0.24 nm)/Pt (0.16 nm)]$_6$/Ru (0.9 nm)/[Pt (0.16 nm)/Co (0.16 nm)]$_4$/Ta (0.2 nm)/FeB (1.0 nm).

The second ferromagnetic metal layer 13 is made of a known material having ferromagnetism, for example, a metal selected from the group consisting of Cr, Mn, Co, Fe, and Ni and a ferromagnetic alloy containing one or more of these metals. Furthermore, the second ferromagnetic metal layer 13 may be made of an alloy (specifically, Co—Fe or Co—Fe—B) or the like which contains one or more of these metals and at least one element from B, C, and N in some cases.

Also, in order to obtain a higher output, it is desirable to use a Heusler alloy such as Co$_2$FeSi as the second ferromagnetic metal layer 13. A Heusler alloy includes an intermetallic compound having a chemical composition of X$_2$YZ, where X is transition metal element or a noble metal element from the Co, Fe, Ni, or Cu groups in the periodic table, Y is a transition metal from the Mn, V, Cr, or Ti groups or an element of the X type, and Z is a typical element from Group III to Group V. For example, Co$_2$FeSi, Co$_2$MnSi, Co$_2$Mn$_{1-a}$Fe$_a$Al$_b$Si$_{1-b}$, and the like are exemplary examples.

It is desirable that a thickness of the first ferromagnetic metal layer be 2.5 nm or less when the magnetization direction of the first ferromagnetic metal layer 11 is perpendicular to the laminated surface. In this case, perpendicular magnetic anisotropy can be added to the first ferromagnetic metal layer 11 at an interface between the first ferromagnetic metal layer 11 and the non-magnetic layer 14. Furthermore, it is desirable that the thin first ferromagnetic metal layer 11 be formed in a state in which perpendicular magnetic anisotropy is strengthened. The lower limit value of the thickness of the first ferromagnetic metal layer 11 is not particularly limited, but is preferably 0.5 nm. Furthermore, the thickness of the first ferromagnetic metal layer is more preferably 0.5 nm or more and 2 nm or less, but the present disclosure is not limited thereto.

A known material can be used for the non-magnetic layer 14. For example, when an insulator is used as a material of the non-magnetic layer 14 (when the non-magnetic layer 14 is set as a tunnel barrier layer), Al$_2$O$_3$, SiO$_2$, Mg, MgAl$_2$O$_4$, and the like are exemplary examples. Furthermore, materials obtained by substituting a part of Al, Si, and Mg among these materials with Zn, Be, or the like can be used. Since MgO and MgAl$_2$O$_4$ among them are materials capable of realizing coherent tunneling, MgO and MgAl$_2$O$_4$ are desirable in that they can inject spins efficiently. Furthermore, when a metal is used as a material for the non-magnetic layer 14, Cu, Au, Ag, and the like are exemplary examples.

Also, it is desirable that a cap layer 19 be formed on a surface of the first ferromagnetic metal layer 11 opposite to the non-magnetic layer 14 as shown in FIG. 7. The cap layer 19 can prevent diffusion of elements from the first ferromagnetic metal layer 11 and also contributes to orienting the crystal structure of each layer in the magnetoresistance effect element section 20. Therefore, when the cap layer 19 is provided, the magnetism of the first ferromagnetic metal layer 11 and the second ferromagnetic metal layer 13 can be stabilized and the resistance of the magnetoresistance effect element section 20 can be reduced.

It is desirable to use a material with high conductivity for the cap layer 19. For example, Ru, Ta, Cu, Ag, Au, or the like can be used. A crystal structure of the cap layer 19 is preferably set appropriately and may be a face-centered cubic (fcc) structure, a hexagonal close packed (hcp) structure, or a body-centered cubic (bcc) structure in accordance with a crystal structure of the neighboring ferromagnetic metal layer.

When the spin orbital torque wiring 12 and the magnetoresistance effect element section 20 are connected to each other with the cap layer 19 therebetween, the cap layer 19 is required not to dissipate spins propagating from the spin orbital torque wiring 12. In this regard, since it is known that silver, copper, magnesium, aluminum, and the like have long spin diffusion lengths of 100 nm or more and it is difficult for them to dissipate spins, silver, copper, magnesium, aluminum, and the like are desirable as materials for the cap layer 19.

A thickness of the cap layer 19 is preferably equal to or less than a spin diffusion length of a material constituting the cap layer 19. If the thickness of the cap layer 19 is equal to or less than the spin diffusion length, spins propagating from the spin orbital torque wiring 12 can be sufficiently transferred to the magnetoresistance effect element section 20. Here, the spin orbital torque wiring 12 is directly joined to the first ferromagnetic metal layer 11 in the above-described spin current magnetization rotational element 10 as shown in FIG. 1, but the spin orbital torque wiring 12 may be joined to the first ferromagnetic metal layer 11 with the cap layer 19 therebetween as shown in FIG. 7. In this case, a surface of the spin orbital torque wiring 12 joined to the cap layer 19 (a surface to be joined to the first ferromagnetic metal layer 11 with the cap layer therebetween) is defined as the first surface 12a.

It is desirable that the substrate 18 have excellent flatness. In addition, examples of a material therefor include Si, AlTiC, and the like.

An underlying layer (not shown) may be formed on a surface of the substrate 18 on the magnetoresistance effect element section 20 side. When the underlying layer is formed, crystallinity such as crystal orientation and crystal grain sizes of layers including the first ferromagnetic metal layer 11 laminated above the substrate 18 can be controlled.

Since the underlying layer prevents a current flowing through the wiring layer 17 or the like from dissipating, the underlying layer preferably has insulating properties. As a material for the underlying layer, a nitride, which has a (001)-oriented NaCl structure and includes at least one element selected from the group consisting of Ti, Zr, Nb, V, Hf, Ta, Mo, W, B, Al, and Ce, can also be used.

As a material for the underlying layer, a (002)-oriented perovskite-type conductive oxide represented by a composition expression of $XYO_3$ can also be used. Here, a site X includes at least one element selected from the group consisting of Sr, Ce, Dy, La, K, Ca, Na, Pb, and Ba and a site Y includes at least one element selected from the group consisting of Ti, V, Cr, Mn, Fe, Co, Ni, Ga, Nb, Mo, Ru, Ir, Ta, Ce, and Pb. Examples of a material for the underlying layer also include an oxide which has a (001)-oriented NaCl structure and includes at least one element selected from the group consisting of Mg, Al, and Ce. Examples of a material for the underlying layer also include a material that has a (001)-oriented tetragonal crystal structure or cubic crystal structure and includes at least one element selected from the group consisting of Al, Cr, Fe, Co, Rh, Pd, Ag, Ir, Pt, Au, Mo, and W.

Note that the underlying layer is not limited to a single layer and a plurality of the above-described layers may be laminated. The crystallinity of each of the layers in the magnetoresistance effect element section 20 can be increased and magnetic characteristics can be improved according to a constitution of the underlying layer devised.

The wiring layer 17 is electrically connected to the second ferromagnetic metal layer 13 of the magnetoresistance effect element section 20. The magnetoresistance effect element 100 of FIG. 7 is configured such that a current flows in the lamination direction of the magnetoresistance effect element section 20 in a closed circuit formed by the wiring layer 17, the spin orbital torque wiring 12, and the first power supply. As a material for the wiring layer 17, any materials may be adopted as long as they have high conductivity and examples of the material include aluminum, silver, copper, gold, and the like.

In this embodiment, although the structure of magnetoresistance effect element 100 is termed a bottom-pin structure, since the first ferromagnetic metal layer 11 whose lamination order is later positioned on the side away from the substrate 18 serves as a magnetization free layer, and the second ferromagnetic metal layer 13 whose lamination order is earlier positioned on the side closer to the substrate 18 is the fixed magnetization layer (pinned layer), the structure of the magnetoresistance effect element 100 is not particularly limited, and a so-called top-pin structure may be used.

A current flowing in the lamination direction of the magnetoresistance effect element section 20 induces a spin transfer torque (STT). On the other hand, a current flowing through the spin orbital torque wiring 12 induces an SOT. Both the STT and the SOT contribute to magnetization reversal of the first ferromagnetic metal layer 11.

As described above, a ratio between contributions of the SOT and the STT with respect to the magnetization reversal can be freely controlled by controlling the lamination direction of the magnetoresistance effect element section 20 and the amount of current flowing in a direction that is orthogonal to the lamination direction thereof using two power supplies.

For example, when a large current cannot flow through a device, control can be performed such that an STT with a high energy efficiency for magnetization reversal mainly contributes. That is to say, it is possible to increase an amount of current flowing from the first power supply 15, to decrease an amount of current flowing from the second power supply 16, and to increase a contribution ratio of an STT.

Also, for example, when a thin device is required to be provided and the thickness of the non-magnetic layer 14 needs to be reduced, a current flowing through the non-magnetic layer 14 is required to be reduced. In this case, a contribution ratio of an SOT can be increased by decreasing an amount of current flowing from the first power supply 15 and increasing an amount of current flowing from the second power supply 16.

<Magnetic Memory>

The magnetic memory (MRAM) according to the embodiment includes a plurality of the above-described magnetoresistance effect elements.

(Magnetization Reversal Method)

When magnetization reversal is performed in the magnetoresistance effect element according to the embodiment, it is desirable to set a current density of a current flowing through the spin orbital torque wiring to $1 \times 10^7$ A/cm$^2$ or less. When the current density of the current flowing through the spin orbital torque wiring is too large, heat is generated by the current flowing through the spin orbital torque wiring. When heat is applied to the second ferromagnetic metal layer, the stability of the magnetization in the second ferromagnetic metal layer may be lost and unexpected magnetization reversal or the like may occur in some cases. If such unexpected magnetization reversal occurs, a problem may arise in which recorded information is rewritten. That is to say, in order to prevent unexpected magnetization reversal, it is desirable that a current density of a current flowing through the spin orbital torque wiring does not become too large. If a current density of a current flowing through the spin orbital torque wiring is $1 \times 10^7$ A/cm$^2$ or less, the occurrence of magnetization reversal due to at least generated heat can be prevented.

In the magnetization reversal method, in the magnetoresistance effect element according to the embodiment, in the case of a constitution in which "an STT and an SOT are used together," a current may be applied to the power supply of the spin orbital torque wiring and then a current may be applied to the power supply of the magnetoresistance effect element. An SOT magnetization reversal step and an STT magnetization reversal step may be performed at the same time or an STT magnetization reversal step may be additionally performed after an SOT magnetization reversal step has previously been performed. A current may be supplied simultaneously from the first power supply 15 and the second power supply 16 or a current may be additionally supplied from the first power supply 15 after a current has been supplied from the second power supply 16, but in order to more reliably obtain an assist effect for magnetization reversal using an SOT, it is desirable to apply a current to the power supply of the magnetoresistance effect element after applying a current to the power supply of the spin orbital torque wiring. That is to say, it is desirable to additionally supply a current from the first power supply 15 after supplying a current from the second power supply 16.

INDUSTRIAL APPLICABILITY

According to a spin current magnetization rotational element of the present disclosure, an reversal current density can be reduced using magnetization reversal due to a pure spin current.

REFERENCE SIGNS LIST

100 Magnetoresistance effect element
10 Spin current magnetization rotational element
11 First ferromagnetic metal layer
11a First surface of first ferromagnetic metal layer
12 Spin orbital torque wiring
12a First surface of spin orbital torque wiring
12b Second surface of spin orbital torque wiring
13 Second ferromagnetic metal layer
14 Non-magnetic material layer
15 First power supply
16 Second power supply
17 Wiring layer
18 Substrate
19 Cap layer
20 Magnetic effect resistance effect element section

What is claimed is:

1. A spin current magnetization rotational element, comprising:
    a first ferromagnetic metal layer having a variable magnetization direction; and
    a spin-orbital torque wiring which is joined to the first ferromagnetic metal layer and extends in a direction crossing a direction perpendicular to a plane of the first ferromagnetic metal layer,
    wherein the spin orbital torque wiring is constituted of a non-magnetic material composed of elements of two or more kinds and a compositional proportion of the non-magnetic material has a non-uniform distribution between a first surface joined to the first ferromagnetic metal layer and a second surface located on a side opposite to the first surface,
    the compositional proportion is different between the first surface and the second surface, and
    the compositional proportion has a distribution in a direction other than the direction perpendicular to the plane of the first ferromagnetic metal layer.
2. The spin current magnetization rotational element according to claim 1, wherein the compositional proportion has a distribution in the direction perpendicular to the plane of the first ferromagnetic metal layer.
3. The spin current magnetization rotational element according to claim 1, wherein the compositional proportion has a continuous distribution.
4. The spin current magnetization rotational element according to claim 3, wherein the compositional proportion has a distribution that monotonically increases from the first surface toward the second surface.
5. The spin current magnetization rotational element according to claim 3, wherein the compositional proportion has a distribution that monotonically decreases from the first surface toward the second surface.
6. The spin current magnetization rotational element according to claim 1, wherein the compositional proportion has a peak between the first surface and the second surface.
7. The spin current magnetization rotational element according to claim 1, wherein the spin orbital torque wiring includes both a non-magnetic material including an element having an atomic number of 38 or less and a non-magnetic material including an element having an atomic number equal to or more than 39.
8. The spin current magnetization rotational element according to claim 7, wherein 50 atm % or more of the non-magnetic material including an element having an atomic number equal to or less than 38 is distributed in a region including the first surface and 50 atm % or more of the non-magnetic material including an element having an atomic number equal to or more than 39 is distributed in a region including the second surface.
9. A method of manufacturing the spin current magnetization rotational element according to claim 1, wherein, in a step of forming the spin orbital torque wiring, a laminate is formed with layers made of non-magnetic materials having mutually different compositional proportions and the laminate is subjected to a heat treatment.
10. A magnetoresistance effect element, comprising:
    the spin current magnetization rotational element according to claim 1;
    a second ferromagnetic metal layer having a fixed magnetization direction; and
    a non-magnetic material layer sandwiched between the first ferromagnetic metal layer and the second ferromagnetic metal layer.
11. A magnetic memory, comprising:
    a plurality of the magnetoresistance effect element according to claim 10.
12. The spin current magnetization rotational element according to claim 2, wherein the compositional proportion has a continuous distribution.
13. The spin current magnetization rotational element according to claim 2, wherein the compositional proportion has a peak between the first surface and the second surface.
14. The spin current magnetization rotational element according to claim 3, wherein the compositional proportion has a peak between the first surface and the second surface.

* * * * *